(12) United States Patent  
Furuta

(10) Patent No.: US 8,399,954 B2  
(45) Date of Patent: Mar. 19, 2013

(54) SEMICONDUCTOR INTEGRATED CIRCUIT DEVICE

(75) Inventor: Hiroshi Furuta, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 502 days.

(21) Appl. No.: 11/711,784

(22) Filed: Feb. 28, 2007

(65) Prior Publication Data

US 2007/0222069 A1 Sep. 27, 2007

(30) Foreign Application Priority Data

Mar. 17, 2006 (JP) ................................. 2006-074329

(51) Int. Cl.  
*H01L 21/70* (2006.01)

(52) U.S. Cl. .................. 257/499; 257/758; 257/E21.01; 438/622

(58) Field of Classification Search .................. 499/506; 257/506, 499, 288, E21.01, E21.575, 758–778; 437/636; 438/622  
See application file for complete search history.

(56) References Cited

U.S. PATENT DOCUMENTS

| | | | | |
|---|---|---|---|---|
| 5,173,755 A | * | 12/1992 | Co et al. ........................ | 257/361 |
| 5,218,222 A | * | 6/1993 | Roberts ........................ | 257/362 |
| 6,022,797 A | * | 2/2000 | Ogasawara et al. ........... | 438/622 |
| 6,320,262 B1 | * | 11/2001 | Murakami .................... | 257/758 |
| 6,943,431 B2 | * | 9/2005 | Fukuyama et al. ........... | 257/637 |
| 7,148,575 B2 | | 12/2006 | Matsubara | |
| 7,217,979 B2 | | 5/2007 | Matsunaga et al. | |
| 7,495,288 B2 | | 2/2009 | Matsunaga et al. | |
| 2001/0034121 A1 | * | 10/2001 | Fu et al. ........................ | 438/636 |
| 2005/0093156 A1 | | 5/2005 | Naruse et al. | |
| 2006/0220152 A1 | * | 10/2006 | Huang et al. .................. | 257/408 |
| 2007/0187830 A1 | * | 8/2007 | Matsunaga et al. ........... | 257/758 |
| 2009/0127582 A1 | | 5/2009 | Matsunaga et al. | |

FOREIGN PATENT DOCUMENTS

| | | |
|---|---|---|
| JP | 10-163319 A | 6/1998 |
| JP | 2002-246407 A | 8/2002 |
| JP | 2005-19452 A | 1/2005 |
| JP | 2005-129902 A | 5/2005 |
| JP | 2005-223245 A | 8/2005 |
| JP | 2006-013056 A | 1/2006 |
| JP | 2006-19312 A | 1/2006 |

OTHER PUBLICATIONS

J.R. Kokan et al, Sol-Gel Processing of Porous Silica Thin Films for Interlevel Dielectrics in Integrated Circuits, IEEE 1994, p. 704 Abstract.*  
CRC Handbook of Chemistry and Physics, H. P. R. Frederikse, 88th Edition, 2007-2008, p. 12-51.*  
S. Voldman et al., "High-Current Characterization of Dual-Damascene Copper Interconnects in $SiO_2$-and Low-k Interlevel Dielectrics for Advanced CMOS Semiconductor Technologies," IEEE International Reliability Physics Symposium, 1999, pp. 144-153.

* cited by examiner

*Primary Examiner* — Eugene Lee  
*Assistant Examiner* — Fang-Xing Jiang  
(74) *Attorney, Agent, or Firm* — Foley & Lardner LLP

(57) ABSTRACT

A semiconductor integrated circuit device according to an embodiment of the invention includes: a protective element formed on a semiconductor substrate; and a plurality of wiring layers composed of insulating layers including a layer that is a low dielectric-constant film, and metal lines, in which a metal line in a second wiring layer and a metal line in a first wiring layer among the plurality of wiring layers extend from the other region above the semiconductor substrate to a region electrically connected with the protective element.

12 Claims, 14 Drawing Sheets

RELATED ART

SEMICONDUCTOR INTEGRATED CIRCUIT DEVICE

BACKGROUND OF THE INVENTION

1. Field of the Invention

The present invention relates to a semiconductor integrated circuit device, and more particularly to a semiconductor integrated circuit device having a multilayer wiring structure where a low dielectric-constant film is used as an insulating layer.

2. Description of Related Art

In recent years, as LSIs (MOSLSIs) including a MOSFET (Metal Oxide Semiconductor Field Effect Transistor) have proceeded toward fine patterning and multi-layering of lines as well as fine patterning of elements such as a MOSFET, there is a growing demand to increase an access speed. To meet such demand, a low-resistance material is used for a wiring layer, and a dielectric-constant film (Low-k film) having a low dielectric constant is used as an insulating layer between wiring layers.

FIGS. 10 and 11 show an example of a conventional semiconductor integrated circuit device where a low dielectric-constant film is used for an insulating layer. FIGS. 10 and 11 schematically show the structures of an input/output pad and a protective element of the conventional semiconductor integrated circuit device. FIG. 10 is a plan view of a conventional semiconductor integrated circuit device 900. FIG. 11 is a sectional view of FIG. 10.

As shown in FIG. 11, in the conventional semiconductor integrated circuit device 900, a protective element 951 and an input/output pad 952 are formed on or above a semiconductor substrate 910. A protective element 951 has a diffusion region 911, a diffusion region 912, and a gate electrode 913. The protective element 951 and the input/output pad 952 are electrically connected together.

N wiring layers and N insulating layers are laminated on a main surface of the semiconductor substrate 910. As shown in FIG. 11, metal lines 901 to 905 are formed in each of the first to N-th wiring layers. Incidentally, the first wiring layer is the first layer from the main surface of the semiconductor substrate. The N-th wiring layer is the N-th layer from the semiconductor substrate.

The metal line 905 is exposed at the surface of the semiconductor integrated circuit device 900 to constitute an input/output pad 952. Metal lines (from a metal line 905 to a metal line 901) underlying the input/output pad 952 are electrically connected through plural plug contacts 921.

As shown in FIG. 10, the metal line 901 extends from a region of the input/output pad 952 to a region of the protective element 951. The metal line 901 further extends to overlap with a diffusion region 911. The metal line 901 is connected with the diffusion region 911 through plug contacts 922. A metal line 901', which is separated from the metal line 901, is formed in the first wiring layer. The metal line 901' is connected with the diffusion region 912 trough the plug contacts 922.

In the conventional semiconductor integrated circuit device 900, for example, any one of the first to N-th insulating layers is provided as a low dielectric-constant film in order to reduce a wiring capacity between the input/output pad and the protective element. Incidentally, the first insulating layer is the first layer from the main surface of the semiconductor substrate. The N-th insulating layer is the N-th layer from the main surface of the semiconductor substrate.

FIGS. 12A and 12B show another example of the conventional semiconductor integrated circuit device including an insulating layer having low dielectric constant. FIGS. 12A and 12B schematically show a power supply line of a conventional semiconductor integrated circuit device. FIG. 12A is a plan view of a conventional semiconductor integrated circuit device 800. FIG. 12B is a sectional view of FIG. 12A.

As shown in FIG. 12A, the semiconductor integrated circuit device 800 includes a Vcc line 801 and a GND line 802. The Vcc line 801 and the GND line 802 extend in parallel as viewed from above of the semiconductor integrated circuit device 800. As shown in FIG. 12B, the Vcc line 801 and the GND line 802 are formed adjacent to each other in the same wiring layer (k-th wiring layer).

However, in the conventional semiconductor integrated circuit device, various problems arise if a low dielectric-constant film is used (see, for example, S. Voldman et al., "High-Current Characterization of Dual-Damascene Copper Interconnects In $SiO_2$—and Low-k Interlevel Dielectrics for Advanced CMOS Semiconductor Technologies", IEEE International Reliability Physics Symposium, 1999, pp 144-153 or Japanese Unexamined Patent Publication No. 2005-129902 and No. 2005-223245).

The document of S. Voldman et al. describes that if an ESD (Electro Static Discharge) current flows through a line surrounded by an insulating layer that is a low dielectric-constant film, a breakdown strength (ESD tolerance) becomes lower than the case where an insulating layer is an $SiO_2$ film.

Japanese Unexamined Patent Publication No. 2005-129902 discloses that a dielectric strength (TDDB: time dependent dielectric breakdown of oxide film) between upper and lower lines of a low dielectric-constant film is lower than a dielectric strength between upper and lower lines of a $SiO_2$ film. Incidentally, Japanese Unexamined Patent Publication No. 2005-129902 also discloses a relation between a dielectric constant and a TDDB-resistance life. Japanese Unexamined Patent Publication No. 2005-223245 describes a problem that cracking occurs in a low dielectric-constant film below a bonding pad due to a stress or impact applied upon bonding, as a problem about a mechanical strength in the case of using a low dielectric-constant film for an insulating layer.

As described above, the conventional semiconductor integrated circuit device has a problem in that, if a low dielectric-constant film is used for an insulating layer to realize high-speed operations, breakdown strength, a dielectric strength, and a mechanical strength become lower.

The techniques of the document of S. Voldman et al. and Japanese Unexamined Patent Publication No. 2005-129902 and No. 2005-223245 cannot completely solve these problems. For example, the document of S. Voldman et al. describes only a design rule of the width of a Cu line as a low dielectric-constant film. Japanese Unexamined Patent Publication No. 2005-129902 discloses how to improve TDDB lifetime in terms of a manufacturing process and structure but does not disclose a relation between electric field strength of TDDB lifetime and a layout. Japanese Unexamined Patent Publication No. 2005-223245 discloses an ESD protective element formed below the pad but makes no reference to a relation between a current flowing through the line when the ESD protective element operates and a low dielectric-constant film.

SUMMARY OF THE INVENTION

A semiconductor integrated circuit device according to an aspect of the present invention includes: a pad; an electrostatic protective element electrically connected with the pad; a first line electrically connected with the pad and the electrostatic protective element, and extended between a region below the pad and a region above the electrostatic protective element; a second line electrically connected with the pad and the electrostatic protective element and provided above the first line, and extended between the region below the pad and the region above the electrostatic protective element; and a plurality of insulating layers formed below the first line, between the first line and the second line, and above the second line, at least one of the insulating layer containing a low dielectric constant film.

According to the semiconductor integrated circuit device, an insulating layer of a low dielectric constant is used to enable high-speed operations. Further, a second line is provided above the first line and extends in a same direction of the first line, thereby ESD tolerance is improved.

A semiconductor integrated circuit device according to another aspect of the invention includes: a plurality of insulating layers formed above a main surface of a semiconductor substrate and including at least one insulating layer of a low dielectric constant; and a plurality of lines formed above the main surface of the semiconductor substrate and including a first line and a second line, which is formed above the first line, wherein the first line and the second line are provided in different layers sandwiching two or more of the insulating layers and not to overlap with each other as viewed from above, and the insulating layer just above the first line or the insulating layer just below the second line have a dielectric constant higher than the low dielectric constant.

According to the semiconductor integrated circuit device, a low dielectric-constant film is used as an insulating layer to enable high-speed operations. Further, the first line and the second line are provided in different layers sandwiching two or more of the insulating layers, thereby TDDB lifetime is improved.

A semiconductor integrated circuit device according to another aspect of the invention includes: a MOSFET formed on a main surface of a semiconductor substrate; a plurality of lines formed above the main surface of the semiconductor substrate and including a first line and a second line formed in different layers; and a plurality of insulating layers formed above the main surface of the semiconductor substrate including at least one insulating layer of a low dielectric constant, wherein the first line is formed above a source diffusion region of the MOSFET and connected with the source diffusion region electrically, and the second line is formed above a drain diffusion region of the MOSFET and connected with the drain diffusion region electrically.

According to the semiconductor integrated circuit device, a low dielectric-constant film is used as an insulating layer to enable high-speed operations. Further, a first line and a second line which are connected with the diffusion region of the MOSFET are formed in different layers, thereby TDDB lifetime is improved.

According to the present invention, it is possible to provide a semiconductor integrated circuit device capable of operating at high speeds and improving ESD tolerance of a metal line, TDDB lifetime of an interlayer insulating layer, and mechanical strength.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

A semiconductor integrated circuit device according to a first embodiment of the present invention is described first. A low dielectric-constant film is used for an insulating layer of the semiconductor integrated circuit device of this embodiment. In the semiconductor integrated circuit device of this embodiment, a metal line extending toward a protective element is formed in plural wiring layers.

Figure 1:
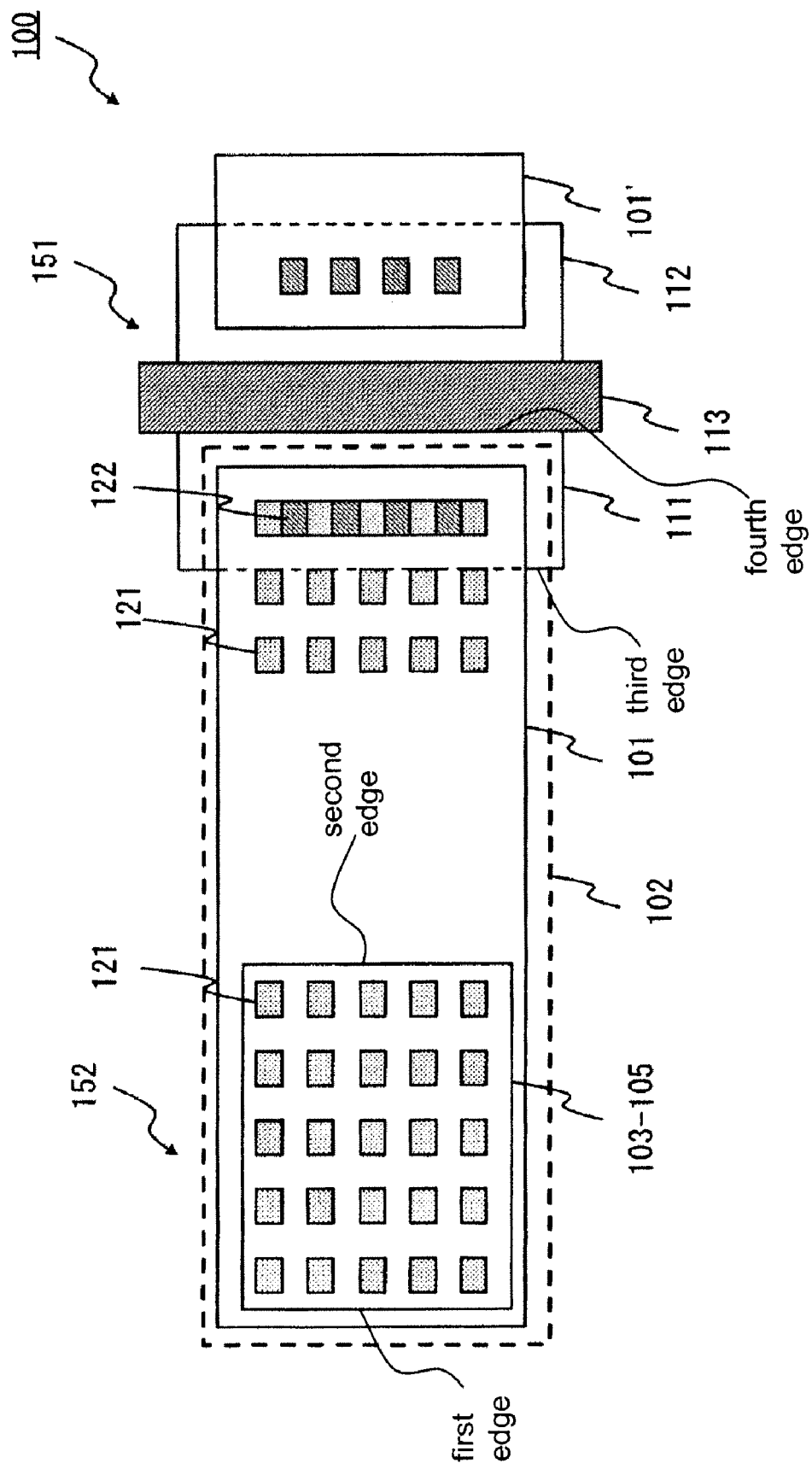
FIG. 1 is a plan view of a semiconductor integrated circuit device according to a first embodiment of the present invention.
Figure 2:
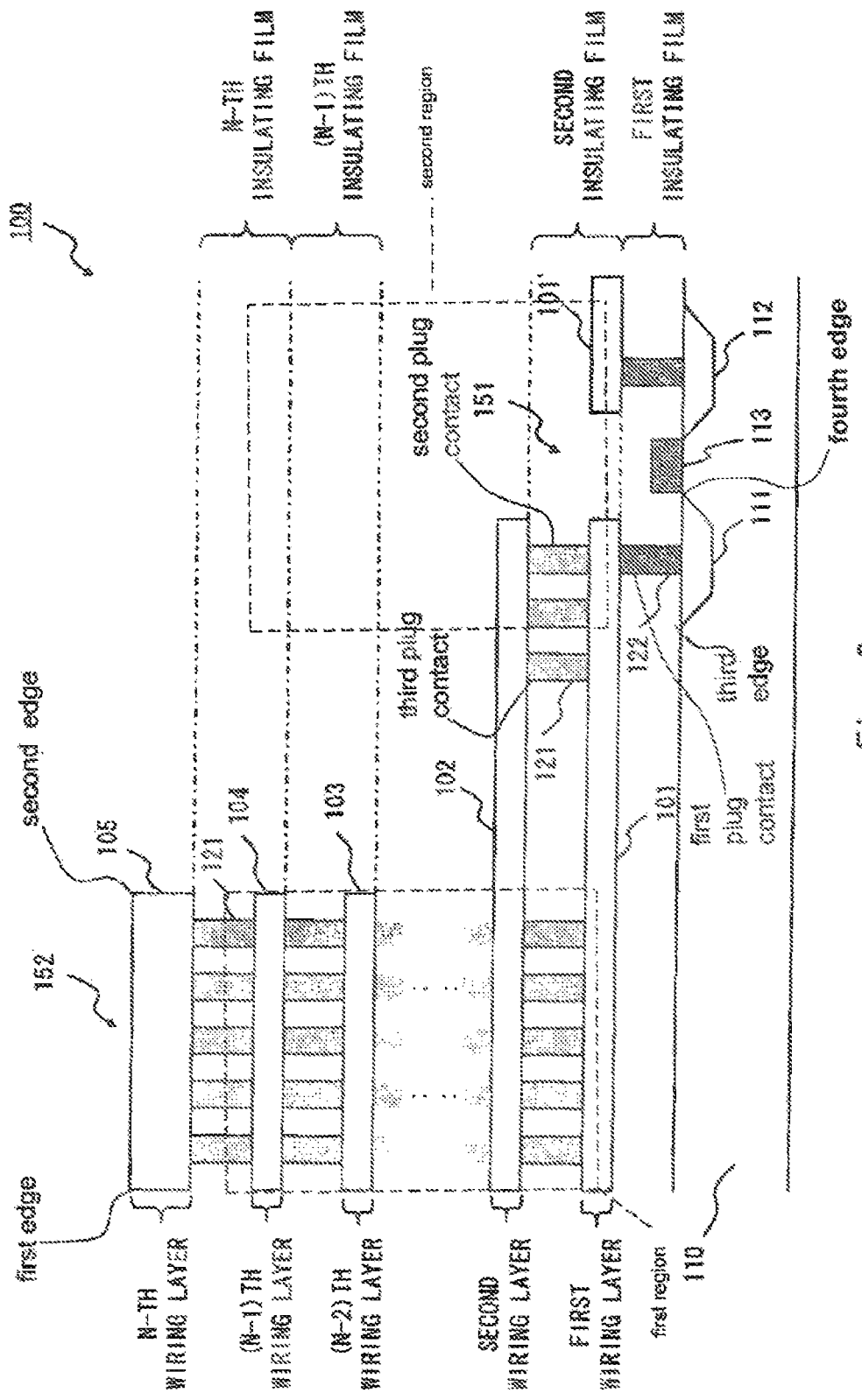
FIG. 2 is a sectional view of the semiconductor integrated circuit device according to the first embodiment of the present invention.

Referring to FIGS. 1 and 2, the configuration of the semiconductor integrated circuit device of this embodiment is described below. FIGS. 1 and 2 show the structures of an input/output pad and a protective element of a semiconductor integrated circuit device 100. FIG. 1 is a plan view of the semiconductor integrated circuit device 100. FIG. 2 is a sectional view of the semiconductor integrated circuit device 100 as shown in FIG. 1.

As shown in FIG. 2, the semiconductor integrated circuit device 100 includes a protective element 151 and an input/output pad 152. The protective element 151 and the input/output pad 152 are formed on a main surface of the semiconductor substrate 110. Further, the protective element 151 and the input/output pad 152 are electrically connected. The input/output pad 152 is electrically connected with an external wire through bonding or the like. That is, the input/output pad 152 is a so-called external terminal.

The protective element 151 is an ESD protective element. In other words, the protective element 151 protects the semiconductor integrated circuit device 100 against breakdown due to an ESD current from the input/output pad 152. That is, the protective element 151 is an electrostatic protective element. A power supply potential, a ground potential, and input/output signals are applied to the protective element 151 from the input/output pad 152.

As shown in FIG. 2, the protective element 151 has a MOSFET structure. The protective element 151 includes a diffusion region 111, a diffusion region 112, and a gate electrode 113. The diffusion regions 111 and 112 are formed on the main surface of the semiconductor substrate 110. The gate electrode 113 is formed on the main surface of the semiconductor substrate 110 between the diffusion regions 111 and 112.

The semiconductor substrate 110 is a P-type semiconductor substrate or a P-type well. The diffusion regions 111 and 112 are N+ diffusion regions. Incidentally, the protective element 151 is not limited to the MOSFET. That is, the protective element 151 may be a semiconductor device such as a diode.

As shown in FIG. 2, lines and insulating layers are laminated on the main surface of the semiconductor substrate 110. Here, N lines and N insulating layers are formed on the main surface of the semiconductor substrate 110. As shown in FIG. 2, the line is formed on the insulating layer. Each line is formed on the insulating layer that is planarized through a CMP (Chemical Mechanical Polishing) process. Incidentally, each line is a metal line.

The first to N-th lines formed on the gate electrode 113 correspond to metal lines 101 to 105, respectively. Incidentally, the first line is positioned first from the surface of the semiconductor substrate (the lowest line). The N-th line is positioned N-th from the surface of the semiconductor substrate. Each line is formed after the formation of the gate electrode 113.

The metal line 105 is formed in the top wiring layer and exposed at the surface of the semiconductor integrated circuit device 100. Then, an exposed portion of the metal line 105 is used as the input/output pad 152. Incidentally, an additional wiring layer for an input/output pad may be formed on the metal line 105.

Plural plug contacts 121 are formed below the input/output pad 152. Plug contacts 121 connect the metal line 105 and the metal line 101. The metal lines including the metal line 105 to the metal line 101 are electrically connected through the plug contacts 121.

In this embodiment, the plural plug contacts 121 are formed in lattice shape as viewed from the input/output pad 152. This makes it possible to soften an impact upon bonding or probing and prevent the occurrence of cracking.

As shown in FIGS. 1 and 2, the metal line (lower metal line) 101 extends from a region of the input/output pad 152 to a region of the protective element 151. Here, the metal line 101 extends up to a region above the diffusion region 111 of the protective element 151. Then, the metal line 101 is connected with the diffusion region 111 through the plug contact 122.

Further, as shown in FIGS. 1 and 2, a metal line 101' is formed away from the metal line 101 in the first wiring layer. The metal line 101' is separated from the metal line 101. The metal line 101' is connected with the diffusion region 112 through the plug contact 122.

In this embodiment, the metal line (upper metal line) 102 also extends from a region of the input/output pad 152 to a region of the protective element 151 similar to the metal line 101. Incidentally, the metal line 102 is formed in a wiring layer above the metal line 101. As shown in FIG. 2, the metal line 102 extends substantially in parallel with the metal line 101 towards the protective element 151 as viewed in section of the semiconductor integrated circuit device. In other words, the metal line 102 and the metal line 101 have almost the same shape. Incidentally, the metal line 102 may extend up to a portion above the diffusion region 112, and then the metal line 102 and the diffusion region 112 may be electrically connected.

As shown in FIG. 2, the metal line 102 and the metal line 101 are connected together through the plug contact 121, near the diffusion region 111 of the protective element 151. The plural plug contacts 121 for connecting the metal line 101 and the metal line 102 are formed in lattice shape near the protective element 151 similar to the plug contacts 121 formed below the input/output pad 152.

The following features are also shown in the semiconductor integrated circuit device as shown in FIGS. 1 and 2: a first region, a second region, a first edge, a second edge, a third edge, a fourth edge, a first plug contact, a second plug contact, and a third plug contact. The metal line 105 (pad) extends directly over the first region, where the first region is directly under the metal line 105. The electrostatic protective element 151 extends below the second region directly above the substrate 110 and laterally separated from the first region. The second region is directly above the entire electrostatic protective element 151. The first plug contact extends between the metal line 101 and the electrostatic protective element 151 and is electrically connected to the metal line 101 and to the electrostatic protective element 151, respectively. The metal line 102 is electrically connected with the metal line 105 and the electrostatic protective element 151. The metal line 102 is provided above the metal line 101, and is extended at least between the first and second regions. The second plug contact is directly above the electrostatic protective element 151, extends between the metal line 102 and the metal line 101, and is electrically connected to the metal line 102 and to the metal line 101, respectively. The third plug contact extends between the metal line 102 and the metal line 101, is electrically connected to the metal line 102 and to the metal line 101, respectively, and is arranged at least between the first and second regions. The third plug contact is arranged so as not to be directly over the electrostatic protective element 151.

In the semiconductor integrated circuit device 100, any one of the first to N-th insulating layers is provided as a low dielectric-constant film. Thus, an interwiring capacitance is reduced. Incidentally, the first insulating layer is positioned first from the surface of the semiconductor substrate (lowermost insulating layer). The N-th insulating layer is positioned N-th from the surface of the semiconductor substrate (uppermost insulating layer). Further, the term "low dielectric-constant film" specified herein means an insulating layer having a lower dielectric constant than that of a $SiO_2$ film. For example, the film is made of HSQ (hydrogen silsequioxane), fluorinated silicon oxide (SiOF), porous polymer, or the like.

In this embodiment, the first insulating layer just above the semiconductor substrate 110 is a $SiO_2$ film (not a low dielectric-constant film). The second insulating layer between the metal line 101 and the metal line 102 is a low dielectric-constant film or a $SiO_2$ film. All the insulating layers above the metal line 102 are low dielectric-constant films. To reduce a capacitance component between metal lines, it is desirable that at least ½ from the insulating layer (third insulating layer) on the metal line 102 to the uppermost N-th insulating layer may be low dielectric-constant films.

FIGS. 1 and 2 show an example where the metal line 101 and the metal line 102 extend up to a region above the protective element. However, the present invention is not limited to this combination. It is preferable that the k-th (k is 1 to N−1)

metal line and the m-th (m is 2 to N) metal line is provided in substantially parallel, and at least one of interlayer insulating films above or below the k-th metal line is a low dielectric-constant film, and at least one of interlayer insulating films above or below the m-th metal line is a low dielectric-constant film. Incidentally, the k-th metal line and the m-th metal line extend toward the diffusion region 111 of the protective element 151 and are connected with the diffusion region 111 through the plug contact 122.

Figure 3:
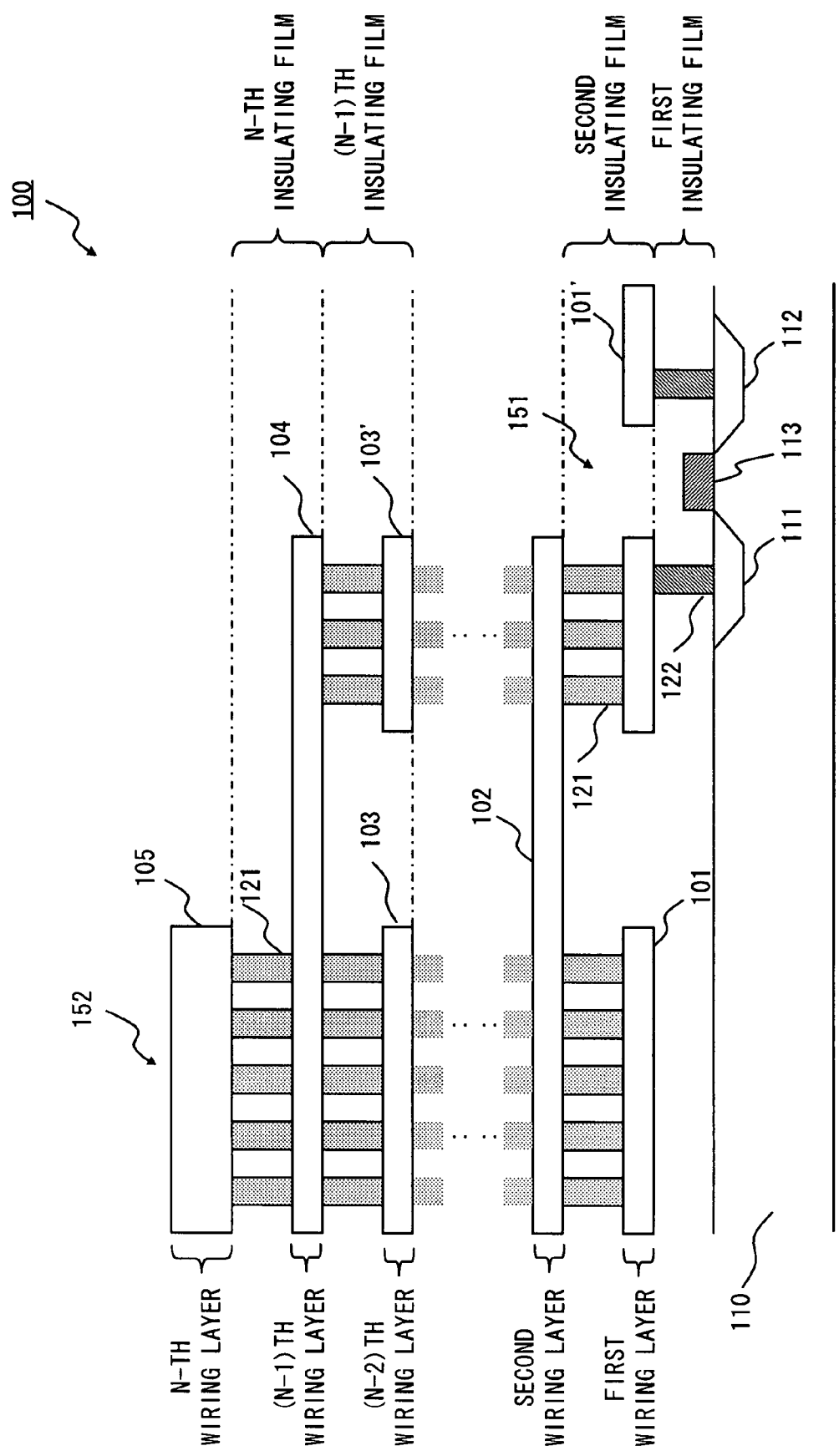
FIG. 3 is a sectional view of the semiconductor integrated circuit device according to the first embodiment of the present invention.
Figure 4:
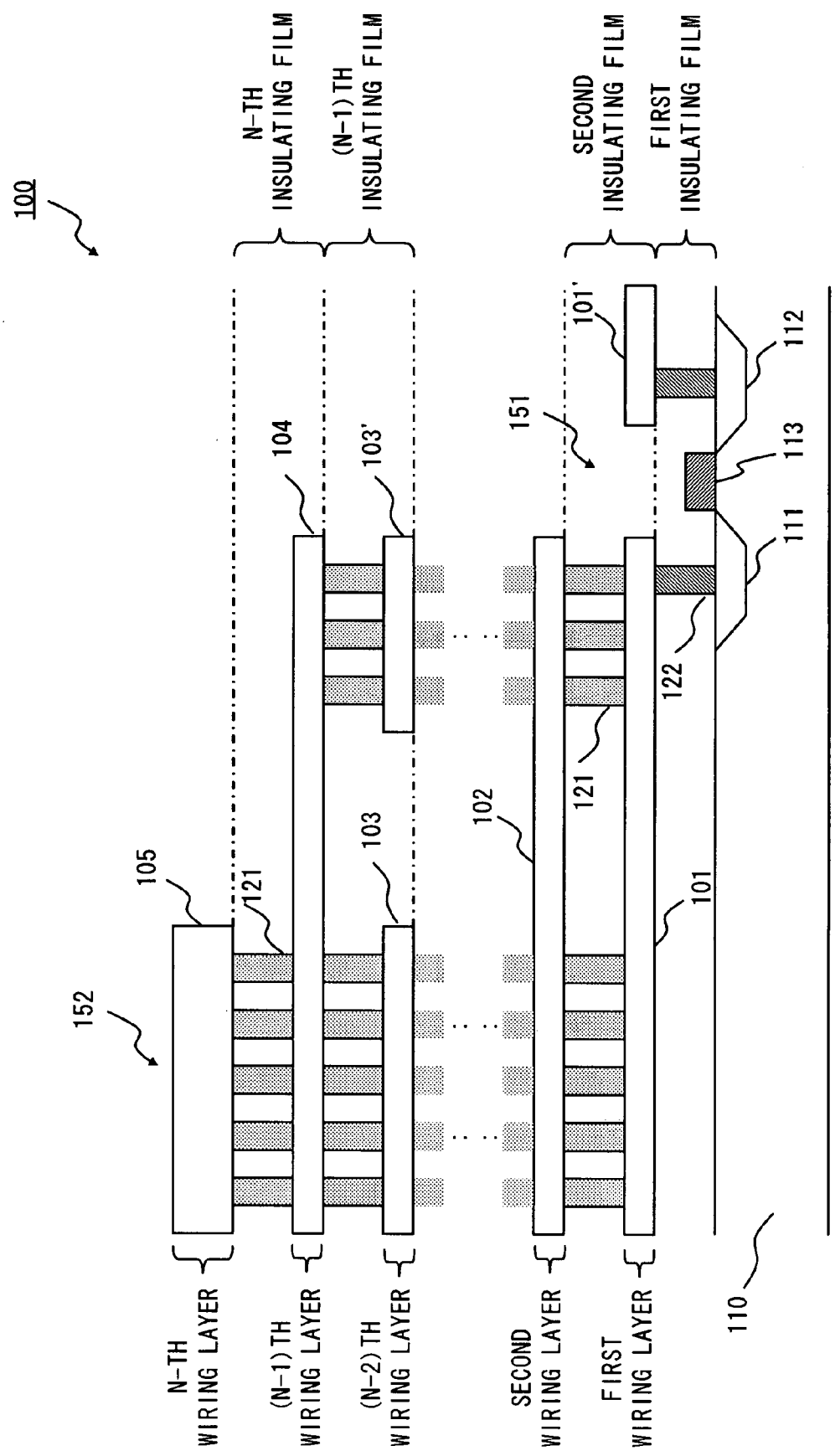
FIG. 4 is a sectional view of the semiconductor integrated circuit device according to the first embodiment of the present invention.

For example, the structures as shown in FIGS. 3 and 4 may be used. FIG. 3 shows an example where the metal line 102 of the second wiring layer and the metal line 104 of the (N−1)th wiring layer extend up to a region above the protective element 151. Incidentally, the metal line 104 and the metal line 102 are connected near the diffusion region 111 of the protective element 151 through the plug contact 121.

In the illustrated example of FIG. 3, the second insulating layer below the metal line 102 is a low dielectric-constant film or a $SiO_2$ film. An insulating layer between the metal line 102 and the metal line 104 is a low dielectric-constant film. N-th insulating layers above the metal line 104 are $SiO_2$ films.

FIG. 4 shows an example where three metal lines, the metal line 101 of the first wiring layer, the metal line 102 of the second wiring layer, and the metal line 104 of the (N−1)th wiring layer extend up to a region above the protective element 151. Incidentally, the metal line 101 and the metal line 102, and the metal line 104 are connected together through the plug contact 121 near the diffusion region 111 of the protective element 151.

In the illustrated example of FIG. 4, the second insulating layer between the metal line 101 and the metal line 102 is a low dielectric-constant film or $SiO_2$ film. An insulating layer between the metal line 102 and the metal line 104 is a low dielectric-constant film. N-th insulating layers above the metal line 104 are $SiO_2$ films.

In this way, even if a low dielectric-constant film is used as an interlayer insulating layer, two metal lines are formed in parallel in order to reduce current density of the metal line. Then, if an ESD current flows, it is possible to prevent the metal line from being fused.

Further, mechanical strength is also improved by providing two metal lines that extend from below the input/output pad, and providing the plug contacts that are formed in lattice shape.

Second Embodiment

Next, a semiconductor integrated circuit device according to a second embodiment of the present invention is described below. A low dielectric-constant film is used for an insulating layer of the semiconductor integrated circuit device of this embodiment. Further, the semiconductor integrated circuit device of this embodiment has two power supply lines formed in different wiring layers.

Figure 5A:
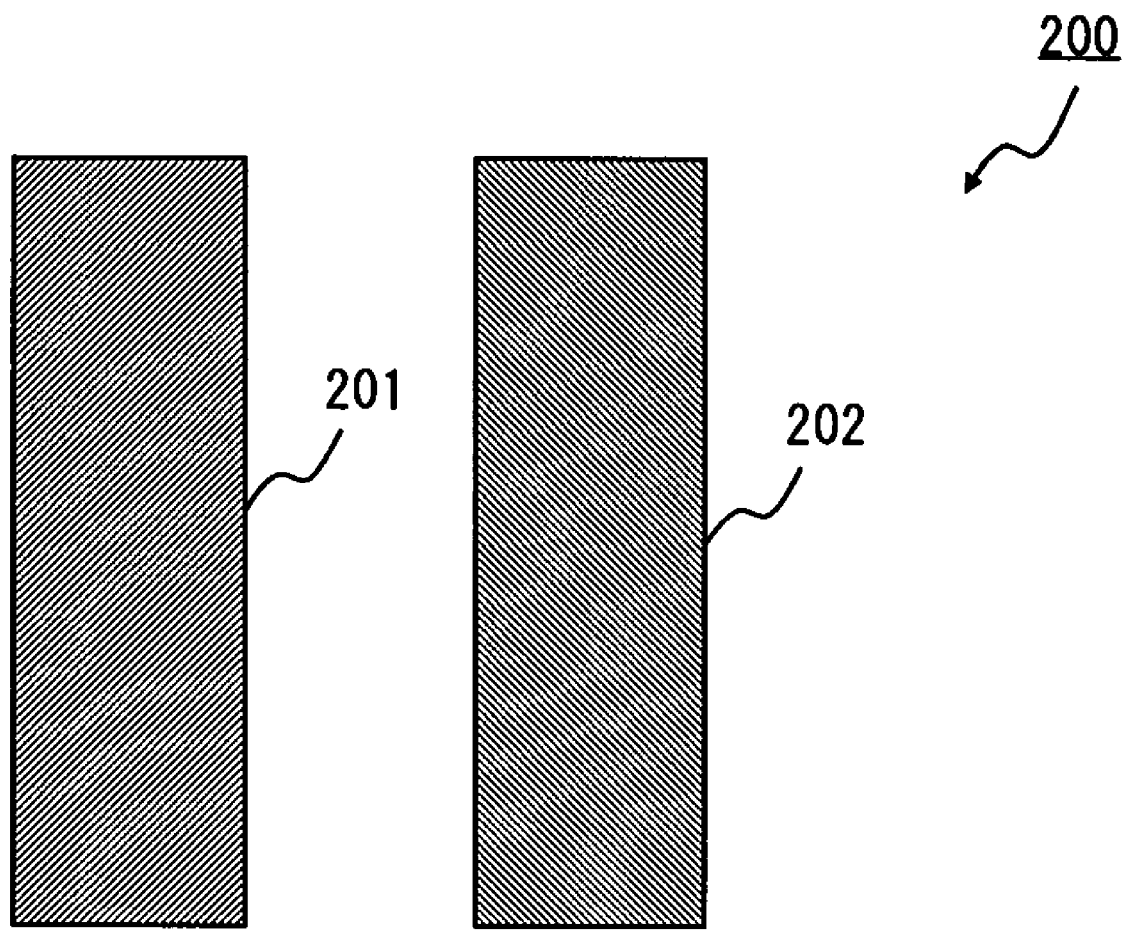
FIGS. 5A and 5B are a plan view and a sectional view of a semiconductor integrated circuit device according to a second embodiment of the present invention.
Figure 5B:
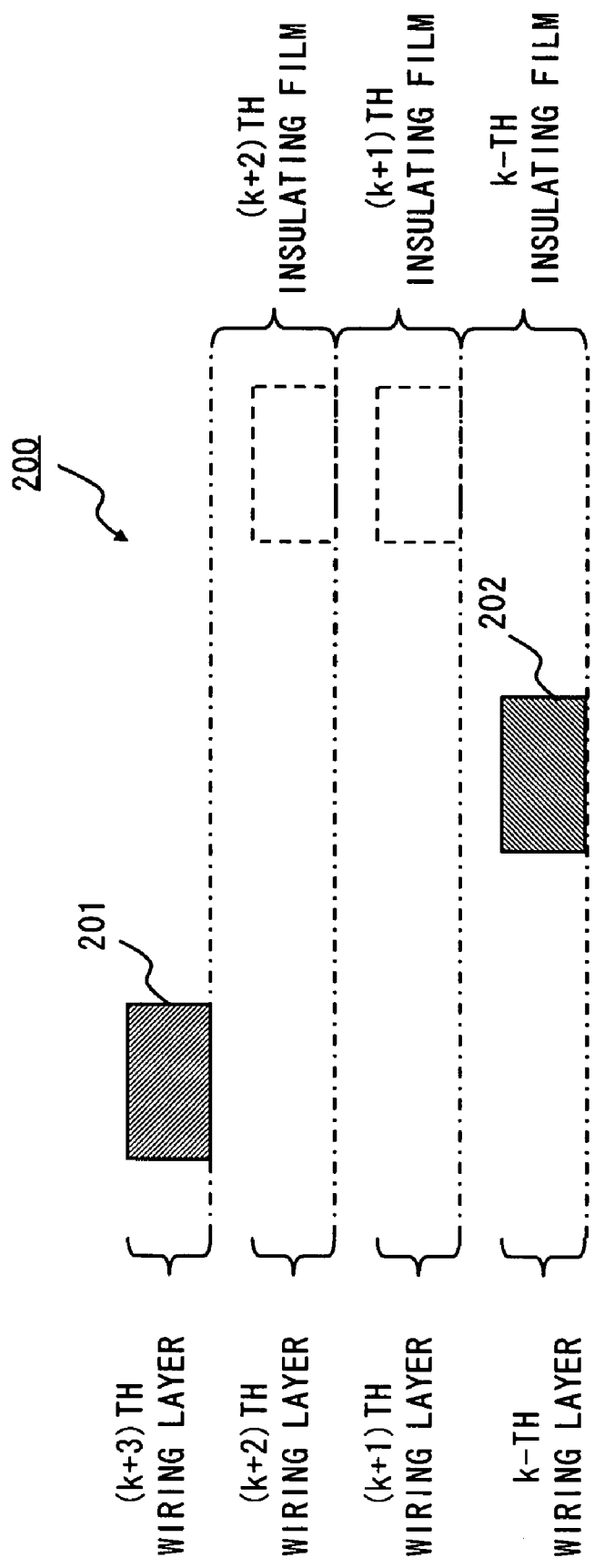

Referring to FIGS. 5A and 5B, the configuration of the semiconductor integrated circuit device of this embodiment is described below. FIGS. 5A and 5B show the structure of power supply lines of a semiconductor integrated circuit device 200. FIG. 5A is a plan view of the semiconductor integrated circuit device 200. FIG. 5B is a sectional view of the semiconductor integrated circuit device 200 of FIG. 5A.

The semiconductor integrated circuit device 200 has a Vcc line 201 supplying a power supply potential and a GND line 202 supplying a ground potential. As shown in FIG. 5A, the Vcc line 201 and the GND line 202 extend in parallel as viewed from above the semiconductor integrated circuit device 200. The length of the Vcc line 201 (the length of an extending direction of the Vcc line 201) is larger than that of a peripheral block. Likewise, the length of the GND line 202 (the length of an extending direction of the GND line 202) is larger than that of the peripheral block.

In this embodiment, the Vcc line 201 and the GND line 202 are formed in different wiring layers as viewed in section of the semiconductor integrated circuit device 200. That is, the Vcc line 201 is an upper metal line formed in a (k+3)th wiring layer. The GND line 202 is a lower metal line formed in a k-th wiring layer. The Vcc line 201 and the GND line 202 are away from each other through two or more insulating layers. Incidentally, one of the Vcc line 201 and the GND line 202 may be a signal line, the potential of which varies between the power supply potential and the ground potential.

A (k+2)th insulating layer near the Vcc line 201 is a low dielectric-constant film. A (k+1)th insulating layer near the GND line 202 is an $SiO_2$ film that is not a low dielectric-constant film. To reduce a inter-wiring capacitance of signal lines (not shown), at least one of two insulating layers between the Vcc line 201 and the GND line 202 is a low dielectric-constant film, and the other insulating layer is not a low dielectric-constant film.

As described above, an insulating layer surrounding one of the two metal lines is a low dielectric-constant film, and an insulating layer surrounding the other metal line is not a low dielectric-constant film, and a reduction of electric field strength between two lines is realized. Accordingly, TDDB lifetime can be improved. That is, a TDDB-resistance life is not reduced even in a semiconductor integrated circuit device using a low dielectric-constant film.

Third Embodiment

Next, a semiconductor integrated circuit device according to a third embodiment of the present invention is described. In the semiconductor integrated circuit device of this embodiment, a low dielectric-constant film is used for an insulating layer. Further, a feature of the semiconductor integrated circuit device of this embodiment is that a source potential line and a drain potential line of a MOSFET are formed in different wiring layers.

Figure 6:
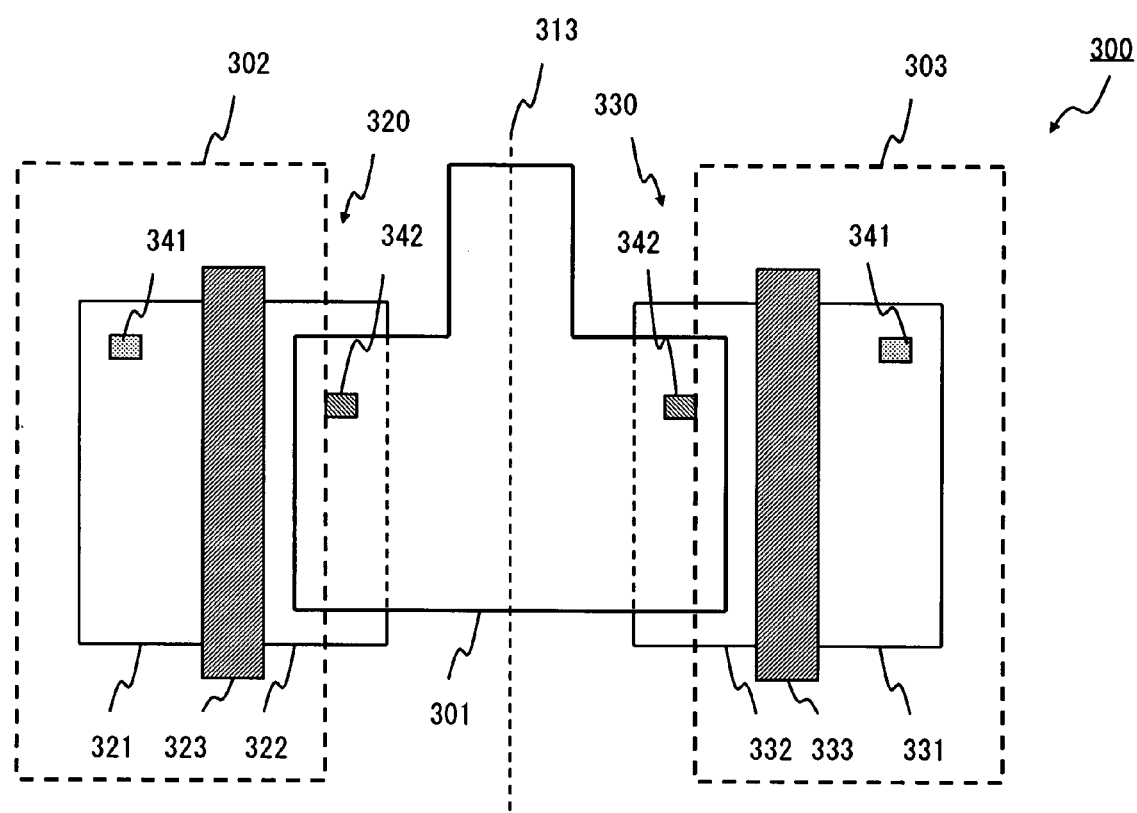
FIG. 6 is a plan view of a semiconductor integrated circuit device according to a third embodiment of the present invention.
Figure 7:
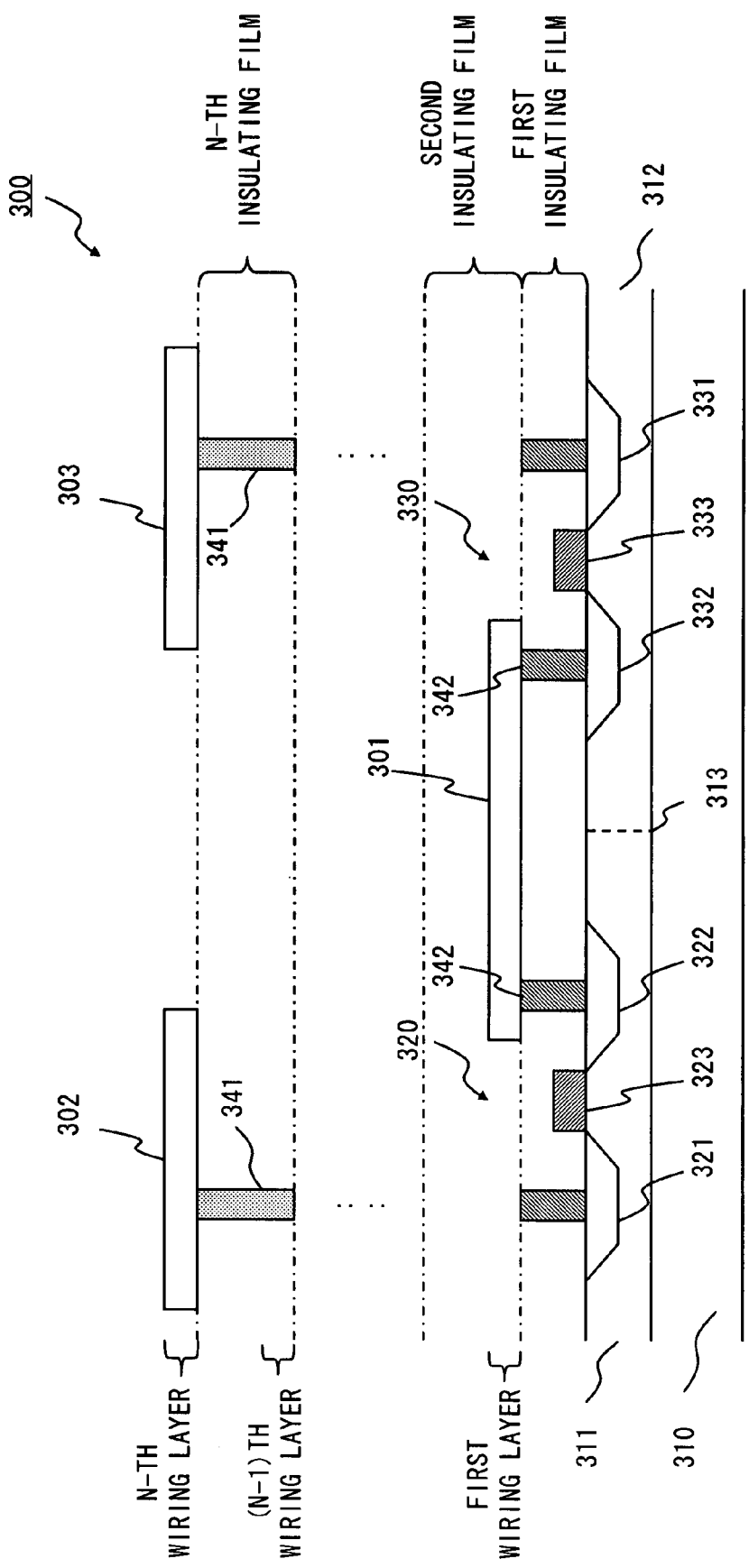
FIG. 7 is a sectional view of the semiconductor integrated circuit device according to the third embodiment of the present invention.

Referring to FIGS. 6 and 7, the configuration of a semiconductor integrated circuit device 300 of this embodiment is described below. FIGS. 6 and 7 show the structures of the MOSFET and source/drain potential lines. FIG. 6 is a plan view of the semiconductor integrated circuit device 300. FIG. 7 is a sectional view of the semiconductor integrated circuit device 300 of FIG. 6.

As shown in FIG. 7, the semiconductor integrated circuit device 300 includes a MOSFET 320, a MOSFET 330, a drain potential line 301, a source potential line 302, and a source potential line 303. The MOSFETs 320 and 330 are formed on the main surface of the semiconductor substrate 310. The drain potential line 301 is connected with a drain region 322 of the MOSFET 320 and a drain region 332 of the MOSFET 330. The source potential line 302 is connected with a source region 321 of a MOSFET 320. A source electric line 303 is connected with a source region 331 of the MOSFET 330. As shown in FIG. 6, gate electrodes 323 and 333 of the MOSFET are arranged in parallel to a PN junction plane 313. Incidentally, FIG. 7 shows an example where one contact is formed in a diffusion region.

The semiconductor substrate 310 is a P-type semiconductor substrate. A well 311 formed at the main surface of the semiconductor substrate 301 is an N-type well. The well 312 formed at the main surface of the semiconductor substrate 301 is a P-type well. The MOSFET 320 is a P-type MOSFET. The MOSFET 330 is an N-type MOSFET. A CMOS circuit is composed from the MOSFETs 320 and 330. The MOSFET 320 includes the source diffusion region 321 that is a P+ type diffusion region, the drain diffusion region 322 that is a P+ type diffusion region, and the gate electrode 323. Likewise, the MOSFET 330 includes the source diffusion region 331 that is an N+ diffusion region, the drain diffusion region 332 that is an N+ diffusion region, and the gate electrode 333.

The drain potential line 301 is formed in the first wiring layer of a lowest wiring layer. The drain potential line 301 extends from a region above the drain diffusion region 322 of the MOSFET 320 to a region above the drain diffusion region 332 of the MOSFET 330. The drain potential line 301 is connected with the drain diffusion region 322 and the drain diffusion region 332 through a plug contact 342. The drain potential line 301 connects between a drain of the MOSFET 320 and a drain of the MOSFET 330 to send output signals of a CMOS circuit in the MOSFETs 320 and 330.

The source potential line 302 and the source potential line 303 are formed away from each other in the uppermost N-th wiring layer. The source potential line 302 is formed above the source diffusion region 321 of the MOSFET 320. Further, the source potential line 302 is also formed above the drain diffusion region 322. Then, the source potential line 302 is connected with the source diffusion region 321 through the plug contact 341.

Likewise, the source potential line 303 is formed above the source diffusion region 331 of the MOSFET 330. Further, the source potential line is formed above the drain diffusion region 332. Then, the source potential line 303 is connected with the source diffusion region 331 through the plug contact 341. The source potential line 302 supplies a power supply potential to the source diffusion region 321. The source potential line 303 is a GND line supplying a GND potential to the source diffusion region 321.

In this embodiment, one of insulating layers from an insulating layer (second insulating layer) above the drain potential line 301 to the uppermost N-th insulating layer is a low dielectric-constant film. Hence, a capacitance between the source potential line and the drain potential line can be reduced.

Further, in this embodiment, two source potential lines (power supply line/GND line) are formed away from each other in the uppermost wiring layer. Since a predetermined distance is provided between the two source potential lines, even if the source potential lines are formed in the same wiring layer, TDDB by no means occurs. Further, in this embodiment, the source potential line is formed in the uppermost wiring layer, the drain potential line is formed in the lowermost wiring layer, and a predetermined distance is provided between the these lines. Hence, electric field strength between the source potential line and the drain potential line is decreased, and a TDDB-resistance life is improved.

Figure 8:
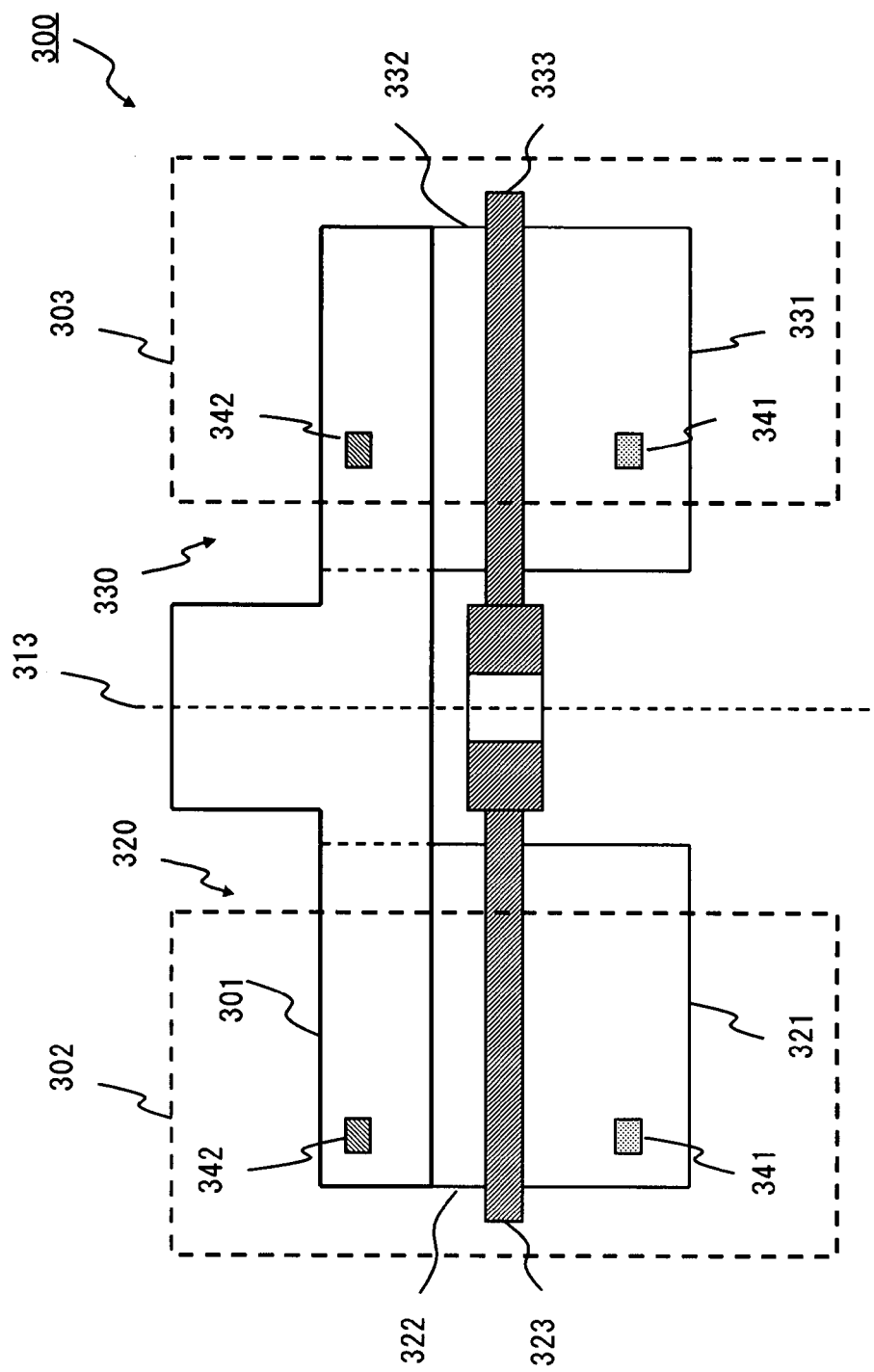
FIG. 8 is a plan view of the semiconductor integrated circuit device according to the third embodiment of the present invention.
Figure 9:
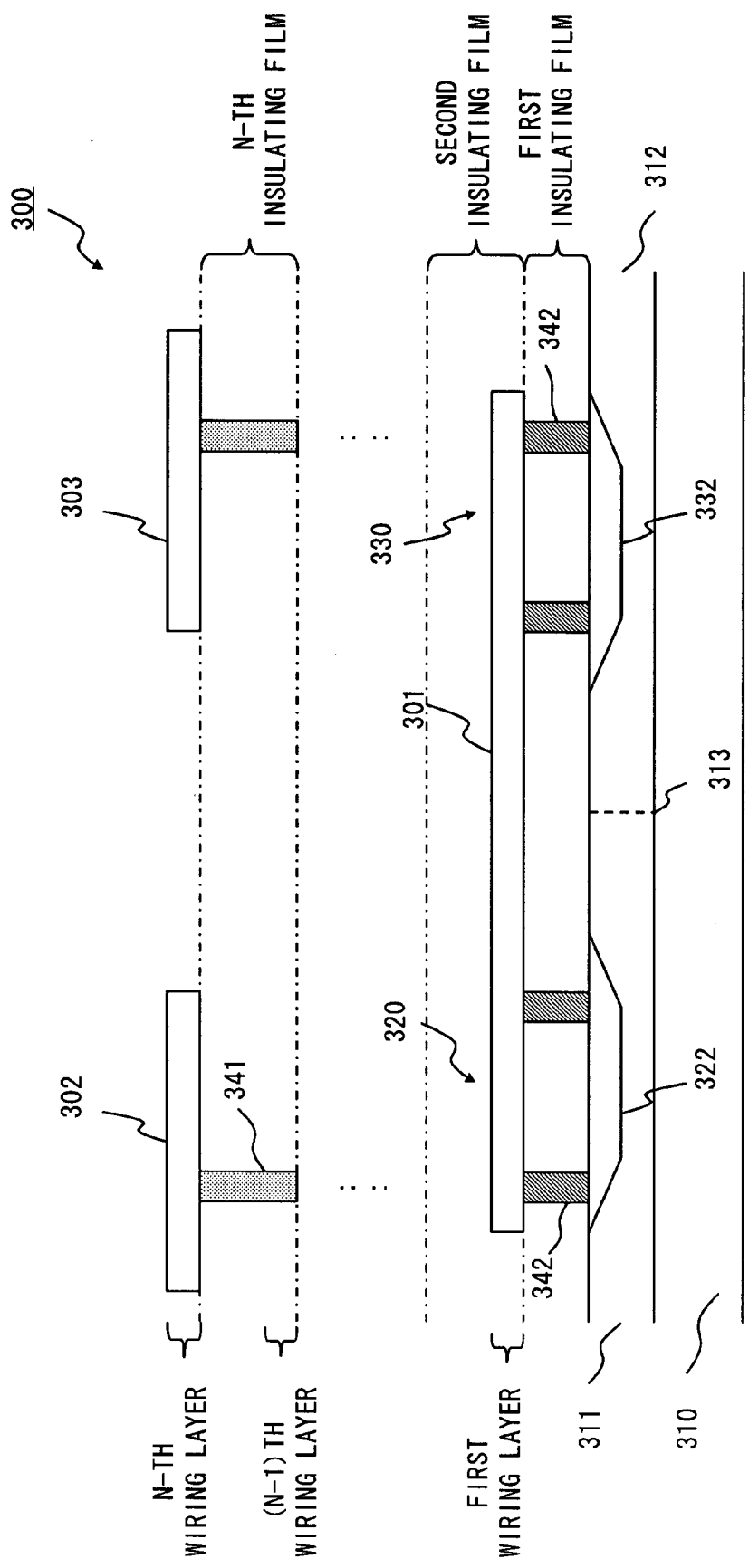
FIG. 9 is a sectional view of the semiconductor integrated circuit device according to the third embodiment of the present invention.
Figure 10:
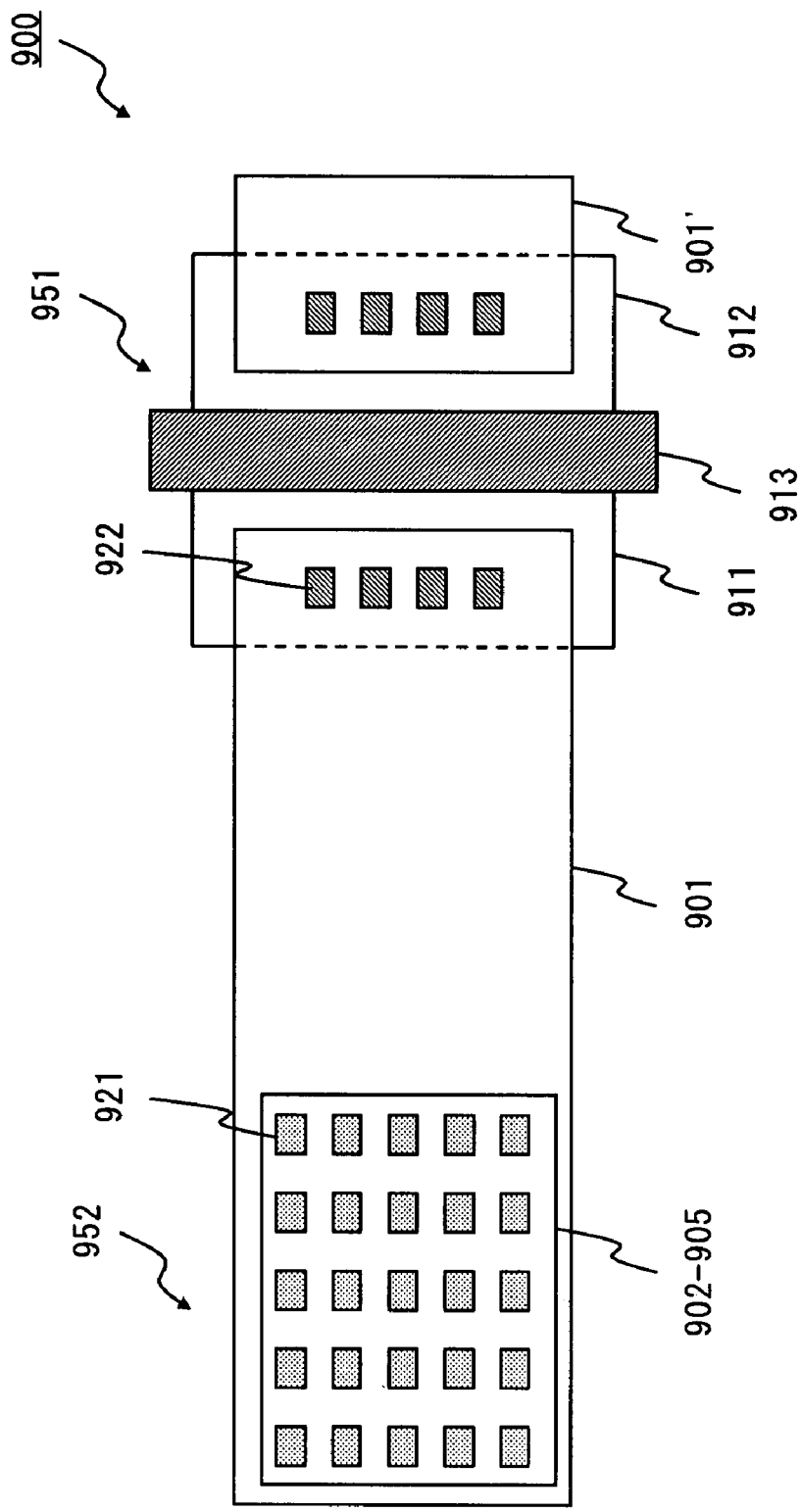
FIG. 10 is a plan view of a conventional semiconductor integrated circuit device.
Figure 11:
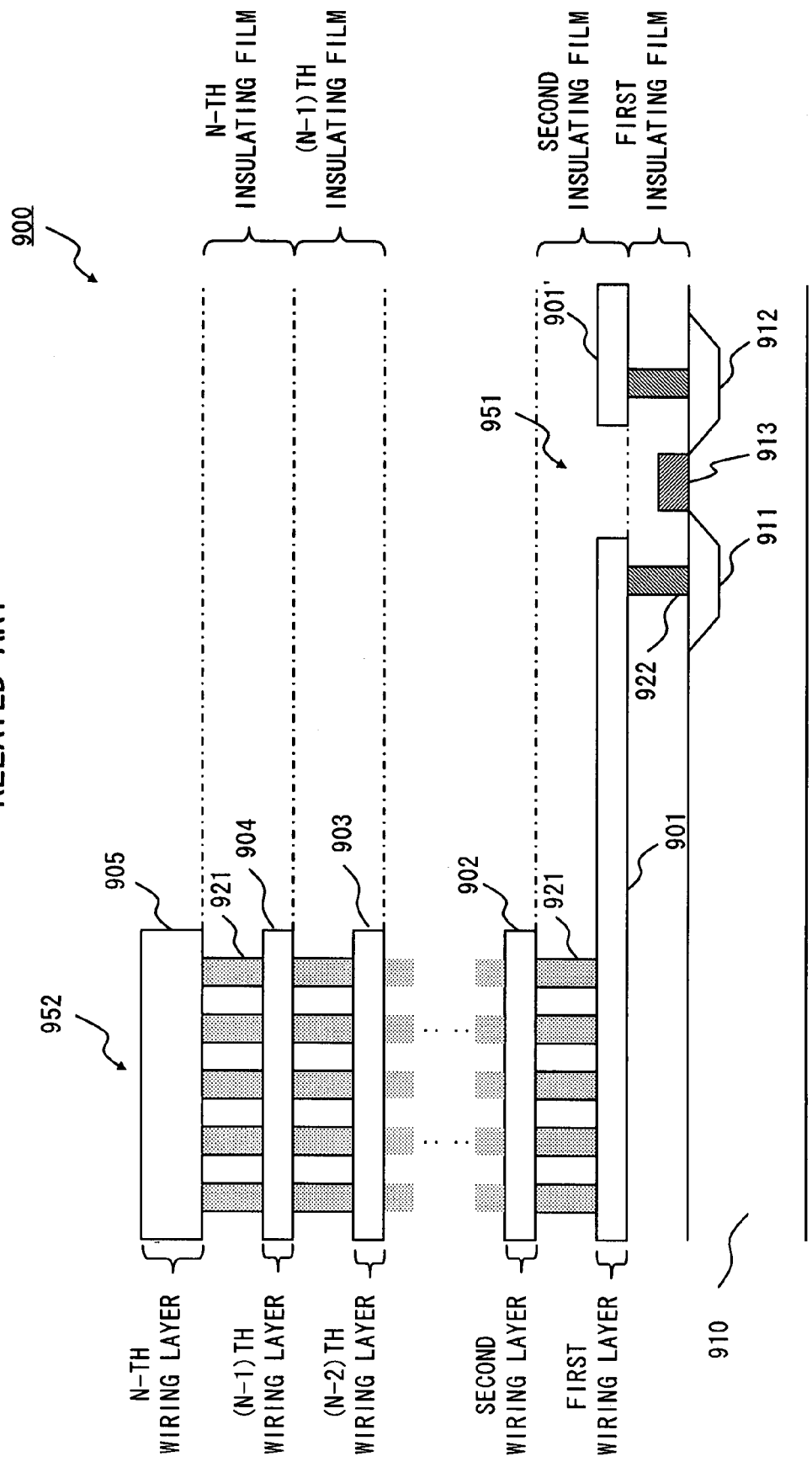
FIG. 11 is a sectional view of a conventional semiconductor integrated circuit device.
Figure 12A:
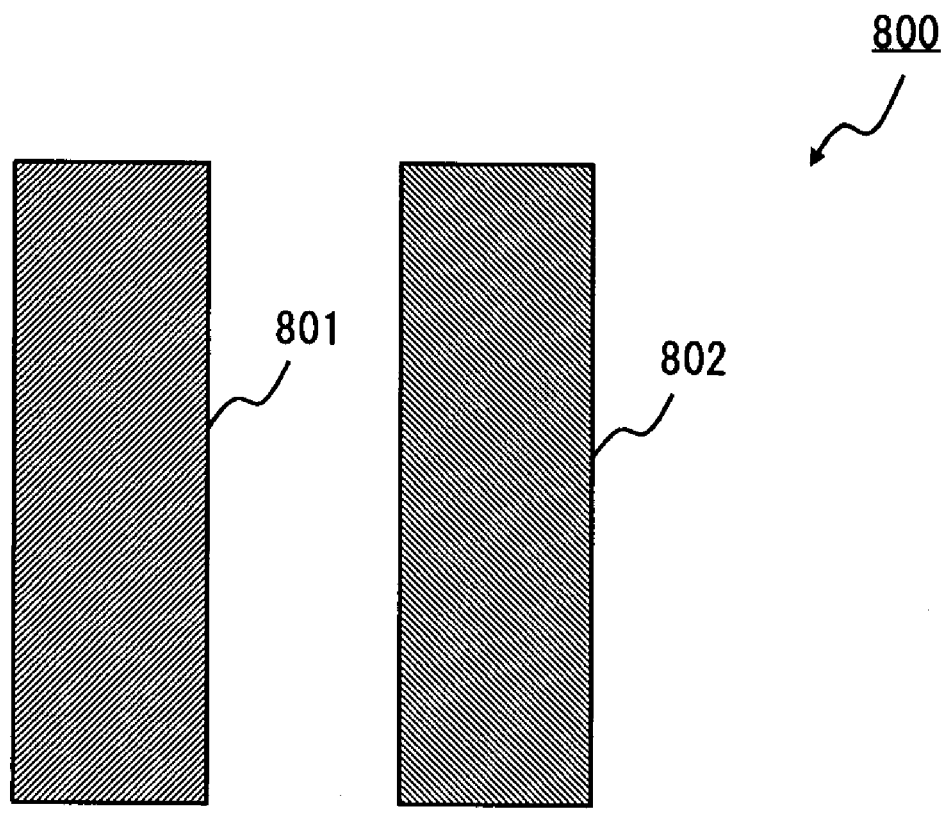
FIGS. 12A and 12B are a plan view and a sectional view of the conventional semiconductor integrated circuit device.
Figure 12B:
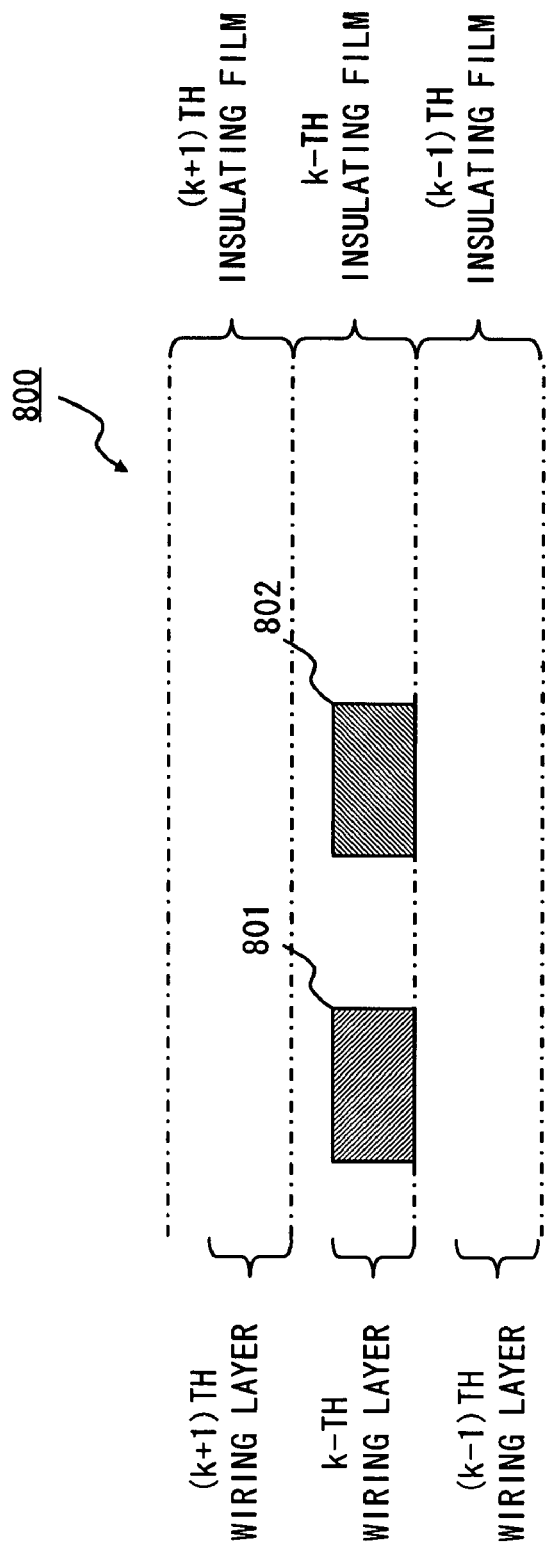

Incidentally, the arrangement of the gate electrodes of the MOSFET is not limited to the above. FIGS. 8 and 9 show an example of the semiconductor integrated circuit device similar to FIGS. 6 and 7. In the illustrated example of FIG. 8, gate electrodes 323 and 333 of the MOSFETs are arranged vertically to the PN junction plane 313. FIG. 8 is a plan view of the semiconductor integrated circuit device 300, and FIG. 9 is a sectional view of FIG. 8. Incidentally, in FIGS. 8 and 9, the same components as those of FIGS. 6 and 7 are denoted by identical reference numerals.

In this example as well, the drain potential line 301 of the first wiring layer is connected with the drain diffusion region 322 and the drain diffusion region 332. The source potential line 302 is connected with the source diffusion region 321. The source potential line 303 is connected with the source diffusion region 331. Incidentally, the source potential line 302 and the source potential line 303 are formed away from each other in the N-th wiring layer.

Accordingly, similar to the illustrated examples of FIGS. 6 and 7, a predetermined distance is provided between the source potential lines. Likewise, a predetermined distance is provided between the drain potential line and the source potential line which are layered on each other. Hence, TDDB by no means occurs. A combination between the source potential line and the drain potential line is not limited to those of FIGS. 6 to 9. That is, it is preferable that a predetermined distance is provided in vertical direction between the two lines, which are layered. And, the two lines may be laminated in the order opposite to that of the above embodiments.

Incidentally, the MOSFET of the above embodiments may be replaced by a MISFET. Any material may be used for lines.

Incidentally, as an example, a low dielectric constant film may be provided at a side surface of the wiring layer at the same height of the wiring layer, and a $SiO_2$ film may extend above the low dielectric constant film and the wiring layer. Or, a $SiO_2$ film may be provided at a side surface of a wiring layer at the same height of the wiring layer, and a low dielectric constant film may extend above the $SiO_2$ film and the wiring layer.

It is apparent that the present invention is not limited to the above embodiment that may be modified and changed without departing from the scope and spirit of the invention.

What is claimed is:

1. A semiconductor integrated circuit device, comprising:
   a semiconductor substrate;
   a pad comprising a top wiring line exposed at a surface of the integrated circuit device, the pad extending directly over a first region between the substrate and the pad, the first region directly under the entire pad;
   an electrostatic protective element electrically connected with the pad, the electrostatic protective element extending below a second region directly above the substrate and laterally separated from the first region, the second region directly above the entire electrostatic protective element;
   a first line electrically connected with the pad and the electrostatic protective element, and extended at least between the first and second regions;
   a first plug contact extending between and electrically connecting the first line and the electrostatic protective element;
   a second line electrically connected with the pad and the electrostatic protective element and provided above the first line, and extended at least between the first and second regions;
   a second plug contact, directly above the electrostatic protective element, and extending between and electrically connecting the second line and the first line;
   a third plug contact, different from the second plug contact, formed between the second line and the first line and is electrically connected to the second line and to the first line, respectively, and arranged at least between the first and second regions, wherein said third plug contact is arranged so as not to be directly over any electrostatic protective element; and
   a plurality of insulating layers formed below the first line, between the first line and the second line, and above the second line, at least one of the insulating layer containing a low dielectric constant film, the low dielectric constant film having a dielectric constant lower than a dielectric constant of silicon dioxide.

2. The semiconductor integrated circuit device according to claim 1, wherein the second line overlaps with the first line as viewed from above.

3. The semiconductor integrated circuit device according to claim 2, wherein the shape of the first line is substantially same as the shape of the second line as viewed from above.

4. The semiconductor integrated circuit device according to claim 1, wherein the first line and the second line extend in a same direction toward a region above the electrostatic protective element.

5. The semiconductor integrated circuit device according to claim 1, wherein the electrostatic protective element is a MOSFET, and
the first line and the second line are connected with a diffusion region of the MOSFET.

6. The semiconductor integrated circuit device according to claim 2, wherein the insulating layer formed just above the main surface of the semiconductor substrate has a dielectric constant higher than the low dielectric constant.

7. The semiconductor integrated circuit device according to claim 6, wherein the first line is formed just above an insulating layer, which is formed directly on the main surface of the semiconductor substrate.

8. The semiconductor integrated circuit device according to claim 2, wherein the electrostatic protective element has a first diffusion region and a second diffusion region on a surface of the semiconductor substrate, and
the first line and second line are both connected with the first diffusion region.

9. The semiconductor integrated circuit device according to claim 1, wherein the insulating layer of the low dielectric constant is formed above the second line or between the first line and the second line, and not less than ½ of the plurality of insulating layers are insulating layers of the low dielectric constant.

10. The semiconductor integrated circuit device according to claim 1, wherein the low dielectric constant film comprises a material selected from hydrogen silsequioxane (HSQ), fluorinated silicon oxide (SiOF), or a porous polymer.

11. The semiconductor integrated circuit device according to claim 1, wherein a plurality of third plug contacts are formed in a direction perpendicular to a direction in which the first line and the second line extend between the first region and the second region, when viewed from the top.

12. A semiconductor integrated circuit device, comprising:
a pad having a first edge and a second edge, said first and said second edges being arranged parallel to each other;
an electrostatic protective element having a diffusion region, said diffusion region having a third edge and a fourth edge, said third edge extending in a direction perpendicular to a lateral direction perpendicular to said second edge, said third and said fourth edges being arranged parallel to each other, and said third edge being arranged parallel to said first edge;
a first line electrically connected with the pad and the electrostatic protective element;
a second line electrically connected with the pad and the electrostatic protective element and provided above the first line, said first and second lines extended at respective levels between a region boundary between the projection of the second edge and the projection of the third edge;
a plug contact extending between and electrically connecting the second line and the first line and being arranged at a level between the region boundary between the projection of the second edge and the projection of the third edge, wherein said plug contact is arranged so as not to be directly over any electrostatic protective element; and
a plurality of insulating layers formed below the first line, between the first line and the second line, and above the second line, at least one of the insulating layers containing a low dielectric constant film, the low dielectric constant film having a dielectric constant lower than a dielectric constant of silicon dioxide.

* * * * *